United States Patent
Wang et al.

(10) Patent No.: US 11,094,549 B2
(45) Date of Patent: Aug. 17, 2021

(54) INDIUM PHOSPHIDE WAFER HAVING PITS ON THE BACK SIDE, METHOD AND ETCHING SOLUTION FOR MANUFACTURING THE SAME

(71) Applicant: BEIJING TONGMEI XTAL TECHNOLOGY CO., LTD., Beijing (CN)

(72) Inventors: Liugang Wang, Beijing (CN); Haimiao Li, Beijing (CN); Sung-Nee George Chu, Fremont, CA (US)

(73) Assignee: BEIJING TONGMEI XTAL TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 16/641,538

(22) PCT Filed: Jun. 29, 2018

(86) PCT No.: PCT/CN2018/093629
§ 371 (c)(1),
(2) Date: Feb. 24, 2020

(87) PCT Pub. No.: WO2019/019859
PCT Pub. Date: Jan. 31, 2019

(65) Prior Publication Data
US 2020/0227268 A1    Jul. 16, 2020

(30) Foreign Application Priority Data
Jul. 25, 2017    (CN) .......................... 201710612344.1

(51) Int. Cl.
*H01L 21/306* (2006.01)
*B24B 37/08* (2012.01)
(Continued)

(52) U.S. Cl.
CPC ........ *H01L 21/30604* (2013.01); *B24B 37/08* (2013.01); *C30B 29/40* (2013.01); *H01L 29/30* (2013.01)

(58) Field of Classification Search
CPC ... B24B 37/08; C30B 29/40; H01L 21/30604; H01L 21/30612; H01L 29/30
See application file for complete search history.

(56) References Cited

U.S. PATENT DOCUMENTS 5,334,284 A * 8/1994 Ngo .................. H01L 21/30612
                                                    252/79.2
5,855,735 A * 1/1999 Takada .................... B24B 37/04
                                                    438/691
(Continued)

FOREIGN PATENT DOCUMENTS

CN    1247382 A    3/2000
CN    1345465 A    4/2002
(Continued)

OTHER PUBLICATIONS

Adachi S: "Chemical Etching of INP and INGAASP/INP" Journal of the Electrochemical Society, vol. 129, No. 3, Mar. 1, 1982, p. 609-613, XP000840504.
(Continued)

*Primary Examiner* — Jaehwan Oh
(74) *Attorney, Agent, or Firm* — Harness, Dickey & Pierce, P.L.C.

(57) ABSTRACT

A {100} indium phosphide (InP) wafer with pits distributed on the back side thereof, a method and an etching solution for manufacturing thereof are provided, wherein the pits on the back side have an elongated shape with a maximum dimension of the long axis of 65 μm, and the pits have a maximum depth of 6.0 μm. The {100} indium phosphide (InP) wafer has controllable pits distribution on the back
(Continued)

side, thus provide a controllable emissivity of the wafer back side surface for better control of wafer back side heating during the epitaxial growth.

13 Claims, 9 Drawing Sheets

(51) Int. Cl.
*C30B 29/40* (2006.01)
*H01L 29/30* (2006.01)

(56) References Cited

U.S. PATENT DOCUMENTS

| | | | |
|---|---|---|---|
| 6,184,064 B1* | 2/2001 | Jiang | H01L 24/32 257/739 |
| 6,261,919 B1 | 7/2001 | Omizo | |
| 7,007,855 B1* | 3/2006 | Barker | H01L 23/544 235/494 |
| 7,323,111 B1* | 1/2008 | Kley | B81C 99/004 216/17 |
| 7,968,354 B1* | 6/2011 | Haller | G01N 21/9501 438/14 |
| 2005/0085008 A1* | 4/2005 | Derderian | H01L 24/27 438/106 |
| 2007/0020887 A1 | 1/2007 | Sekiya | |
| 2007/0212986 A1 | 9/2007 | Priewasser | |
| 2011/0097975 A1 | 4/2011 | Schwandner et al. | |
| 2013/0023107 A1 | 1/2013 | Martin et al. | |
| 2016/0133478 A1 | 5/2016 | Oh et al. | |
| 2017/0363406 A1 | 12/2017 | Fujiwara et al. | |

FOREIGN PATENT DOCUMENTS

| | | |
|---|---|---|
| CN | 102263024 A | 11/2011 |
| CN | 102796526 A | 11/2012 |
| CN | 104900492 A | 9/2015 |
| CN | 205282486 U | 6/2016 |
| EP | 0 981 156 A2 | 2/2000 |
| JP | S60-81829 A | 5/1985 |
| JP | 2013-026614 A | 2/2013 |
| WO | 00-059026 A1 | 10/2000 |
| WO | 2016-129172 A1 | 8/2016 |

OTHER PUBLICATIONS

Kambayash T et al.: "Chemical Etching of INP and Gainasp for Fabricated Laser Diodes and Ntegrated Optical Circuits", Japanese Journal of Applied Physics, Japan Society of Applied Physics, JP, vol. 19, No. 1, Jan. 1, 1980, p. 79-85, XP000817783.

* cited by examiner

INDIUM PHOSPHIDE WAFER HAVING PITS ON THE BACK SIDE, METHOD AND ETCHING SOLUTION FOR MANUFACTURING THE SAME

TECHNICAL FIELD

The present invention relates to a {100} indium phosphide (InP) wafer having pits on the wafer backside surface, to a method and etching solutions for manufacturing the same.

BACKGROUND ART

Indium phosphide (InP) single crystal belongs to a group of III-V compound semiconductor material with a forbidden energy bandgap of 1.35 eV. Indium phosphide (InP) has superior properties such as high electron mobility, good radiation resistance, and high thermal conductivity and high electric breakdown field. Thus, it has been widely used as a main substrate for optoelectronic devices in many fields such as fiber-optic communications, microwave and millimeter wave devices and radiation-resistant solar cells. At present, majority of the monocrystalline indium phosphide (InP) substrates available as commercial products are {100} oriented indium phosphide wafers.

The performance and service life of an indium phosphide device depend mainly on the structure of the device itself and the epitaxial functional layers grown thereon. To form an epitaxial layer structure with good quality on a substrate, it is crucial to control the substrate front surface temperature during epitaxial growth. However, the actual temperature of the front surface is strongly affected by the emissivity of the substrate backside surface that is determined by the surface roughness and morphology. Therefore a high quality substrate not only requires to have a good crystalline quality of the bulk substrate material, the roughness and morphology of the substrate back surface are required to be uniform and controllable to match the epitaxial growth condition. Wafer lapping and etching are crucial steps for manufacturing wafers with a controllable surface roughness and surface morphology.

Chinese Patent Publication No. CN102796526A discloses etching solutions and a method for etching monocrystalline indium phosphide wafers.

Hitherto there is no relevant report about producing a controllable surface roughness and surface morphological features of indium phosphide (InP) wafers. Most of the prior art on {100} indium phosphide wafers has been focused on the front wafer surface cleanliness for epitaxial layer growth.

SUMMARY OF THE INVENTION

The objective of the present invention is to provide a {100} indium phosphide wafer having pits on the back side surface, and also to provide a method for manufacturing the {100} indium phosphide wafer and etching solutions for manufacturing the same.

The present invention is fulfilled by the following technical solutions:

The first aspect of the present invention relates to a {100} indium phosphide (InP) wafer, wherein the wafer has pits on the back side surface, and wherein the pits on the back side surface have an elongated shape with a maximum dimension of the long axis of 65 μm, and the pits have a maximum depth of 6.0 μm.

In a preferred embodiment, the pits on the back side surface have an elongated shape with a maximum dimension of the long axis of 45 μm, and the pits have a maximum depth of 4.5 μm.

The second aspect of the present invention relates to a method for manufacturing the {100} indium phosphide (InP) wafer according to the first aspect of the invention which mentioned in the following scheme:

Scheme

- subjecting the {100} indium phosphide (InP) wafer to surface lapping on both sides;
- etching the {100} indium phosphide (InP) wafer by immersing it into etching solutions to produce etch pits;
- removing the {100} indium phosphide wafer that has been etched and washing it with deionized water;
- protecting the back side surface of {100} indium phosphide (InP) wafer that has been etched;
- subjecting the {100} indium phosphide (InP) wafer which has the back side surface been protected and has been etched to mechanical polishing and chemical polishing, and then washing it with deionized water;
- de-protecting the back side surface of the {100} indium phosphide (InP) wafer;

wherein the etching solutions comprise of an acidic substance, deionized water and an oxidizing agent, an acidic substance, deionized water and oxidizing agent present in the etching solutions are in ratios of 1:(5-15):(0.5-3), based on mole ratio; the etching temperature has a range of from 15 to 80° C., preferably from 18 to 50° C., and more preferably from 20 to 40° C.; and the etching times are from 5 to 40 min, preferably from 10 to 30 min, and more preferably from 10 to 20 min.

The third aspect of the present invention relates to etching solutions for manufacturing the {100} indium phosphide (InP) wafer according to the first aspect of the invention, which comprise of an acidic substance, deionized water and an oxidizing agent; the acidic substance, deionized water and oxidizing agent present in the etching solutions are in ratios of 1:(5-15):(0.5-3), based on mole ratio.

Compared with the prior arts, the present invention has the following advantages:

(1) To provide {100} indium phosphide (InP) wafer with a controllable emissivity of wafer backside surface in epitaxial growth to control wafer front surface temperature;

(2) To provide a uniformly distributed backside surface roughness and pit morphology and hence uniform emissivity for uniform absorption of thermal radiation. A uniform front surface temperature distribution benefits the growth of the epitaxial layer for both material quality and uniformity across the wafer;

(3) The method for manufacturing the {100} indium phosphide (InP) wafer according to the present invention is simple to operate, and easy to manufacture indium phosphide (InP) wafer having controllable surface morphology and good reproducibility

MODE FOR CARRYING OUT THE INVENTION

Figure 1:
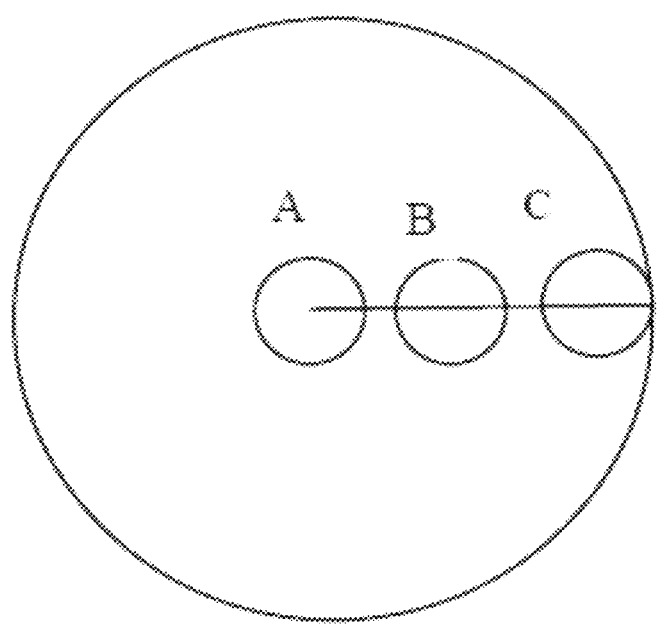
FIG. 1 shows three regions A, B and C to be measured for the morphology of the pits on the back side surface of the wafer according to the present invention.

In the present invention, all operations are carried out at room temperature except etching and under normal pressure unless otherwise specified.

In the present invention, the {100} indium phosphide (InP) wafer shave diameter of 2 to 15 cm, preferably 5 to 12 cm, and has a thickness of 250 to 850 µm, preferably 280 to 750 µm, with pits on the back side.

In the present invention, the diameter of the wafer should be understood as follows: if the wafer is circular, the diameter refers to the diameter of the circle; if the wafer is in other shapes (such as an irregular circle, a square or a rectangle), it refers to the diameter of a circle that is centered at the wafer center and includes all portions of the wafer. The surfaces of the wafer refer to ones that have the largest area and are opposite with each other. The back side surface of the wafer refers to the surface distributed with pits, this surface has not been or would not be subjected to polishing treatment; in contrast, the front side is the surface that has been or will be subjected to mechanical polishing and chemical polishing.

In the present invention, the pits distributed on the back side surface of the {100} indium phosphide wafer results in surface roughness on the back side.

In the present invention, the {100} indium phosphide wafer has pits distributed on the back side surface that may not have necessarily regular shapes; the pits may have regular or irregular shapes. As long as there are portions lower than the backside surface, such as depressions, slots and grooves, it is regarded that pits are formed on the back side of the {100} indium phosphide wafer. The pits on the backside surface may be in various shapes, e.g., a circle, an ellipse, or any other shapes.

According to the actual applications of the wafer, persons of ordinary skills in the art can understand that a {100} indium phosphide wafer having pits on the back side surface refers to a {100} indium phosphide wafer having pits on at least one side, pits may exist on the other side, but have to be finally removed by mechanical and/or chemical polishing. The finally obtained wafer product—the most preferred product—has pits on one side and is smooth on the other side, and particularly has pits on one side and is smooth on the other side owing to mechanical polishing and chemical polishing (this side may be directly used for epitaxial growth). The present invention also includes wafers having pits on both side surfaces; nevertheless, they need to be subjected to further polishing treatment.

During the epitaxial growth, the temperature on the wafer surface directly affects the chemical composition and quality of the epitaxial layer. The temperature on the wafer surface depends on the thermal energy absorbed and transferred during the heating in the epitaxial furnace; the pits and surface morphology on the back side of the wafer result in increased surface area and thus facilitate both thermal radiation absorption and dissipation of the wafer. The thermal energy in the epitaxial reactor is absorbed and transferred mainly in three manners: 1) absorption of thermal radiation, 2) heat transfer by direct contact, and 3) heat transfer by hot gas flow. Roughness of the backside surface of the wafer (mainly caused by pits) and etching morphology are of great significance for controlling the quality of the epitaxial layer.

In the present specification, for conciseness, the same contents applicable to the three aspects of the present invention (indium phosphide wafer having pits on the back side surface, method and etching solutions for manufacturing the same) are not repeated. It should be appreciated, however, that the illustrations on one aspect of the present invention also apply to the other two aspects of the present invention.

The objective of the present invention is fulfilled by the following technical solutions:

The first aspect of the present invention relates to a {100} indium phosphide (InP), wherein the wafer has pits on the back side surface, and wherein the pits on the back side surface have an elongated shape with a maximum dimension of the long axis of 65 µm, and the pits have a maximum depth of 6.0 µm.

In a preferred embodiment, the long axis of the pits on the back side surface have a maximum dimension of 45 µm, and the pits on the backside surface have a maximum depth of 4.5 µm. For thin wafers, the dimensions and depths of the pits are kept at suitable levels so as to be advantageous for maintaining their overall mechanical strength.

The wafers, depending on the processing stages that they are subjected to, may have pits on one side or on both side surfaces.

Wafers having pits on both side surfaces are, for example, wafers that are etched with an etching solution after having been cut from the ingot and undergone surface lapping on both sides, or wafers that still retain the pits after having undergone appropriate mechanical polishing and/or chemical polishing.

Wafers having pits on one single side surface are obtained, for example, by the following steps: after producing pits on both sides surfaces of the wafer, protecting one side surface of the wafer with a protective layer and subjecting the unprotected side to mechanical polishing and/or chemical polishing so as to finally give a wafer with pits on one side. Wafers having pits on one single side may also obtained, for example, by the following steps: a wafer cutting from the ingot, after been subjected to surface lapping on both side, is protected one side with a protective layer, then etching the wafer with an etching solution to give a wafer having pits on one single side; subsequently protecting the side on which pits are formed with a protective layer, removing the protective layer from the side which has been previously protected with the protective layer, performing mechanical polishing and/or chemical polishing on side without pits to finally give a wafer with pits on one side. In one preferred embodiment of the present invention, the side of the wafer distributed with pits has a surface roughness Ra in the range between 0.2 and 1.5 µm, preferably 0.4 and 1.5 µm, and more preferably 0.4 and 1.0 µm; the surface roughness is measured using a surface profiler.

In the present invention, the dimension of the pits on the back side surface refers to a linear distance between two adjacent peaks along the long axis of the elongated shape pits (i.e., protrusions between the pits) measured using a surface profiler, wherein the maximum dimension of the pits on the back side surface is the maximum value of all measured dimensions of the protrusions. Analogously, the depth of the backside pits refers to a distance extending perpendicularly from the backside plane to the bottom of the pits, wherein the maximum depth of the backside pit is the maximum value of all the measured depths of the pit.

In the present invention, the dimension distributions of the pits on the back side surface and the depth of the pits are measured using a surface profiler in three regions shown in FIG. 1: A. the region defined by a circle centered on the center of the circular wafer and having a radius of 0.25 mm; B. the region defined by a circle centered at half of the radius from the center of the wafer and having a radius of 0.25 mm; and C. the region defined by a circle centered at a distance of 0.25 mm from the edge of the wafer and having a radius of 0.25 mm. In the present invention, the dimension of the pits are approximately characterized by the dimension of the long axis of the elongated shape pits, and the depth of the pits are characterized by the degree to which the surface of the single crystal is etched with the etching solution.

In one embodiment of the wafer according to the present invention, the pits on the back side surface have a maximum dimension of the long axis of 65 µm and the pits have a maximum depth of 6.0 µm. The numbers of pits in a circular region with a radius of 0.25 mm is up to 20; the numbers of pits having a depth greater than 2 µm is not less than 21% of the total number of pits in the entire region.

In a preferred embodiment of the wafer according to the present invention, the pits on the back side surface have a maximum dimension of the long axis of 60 µm and the pits have a maximum depth of 5.2 µm. The numbers of pits in a circular region with a radius of 0.25 mm is up to 21; the numbers of pits with a depth greater than 2 µm is not less than 22% of the total number of pits in the entire region.

In a preferred embodiment of the wafer according to the present invention, the pits on the back side surface have a maximum dimension of the long axis of 57 µm and the pits have a maximum depth of 5.4 µm. The numbers of pits in a circular region with a radius of 0.25 mm is up to 24; the numbers of pits with a depth greater than 2 µm is not less than 22% of the total number of pits in the entire region.

In a further preferred embodiment of the wafer according to the present invention, the pits on the back side surface have a maximum dimension of the long axis of 45 µm and the pits have a maximum depth of 4.5 µm. The numbers of pits in a circular region with a radius of 0.25 mm is up to 31; the numbers of pits with a depth greater than 1 µm is not less than 27% of the total number of pits in the entire region.

In a further preferred embodiment of the wafer according to the present invention, the pits on the back side surface have a maximum dimension of the long axis of 40 µm and the pits have a maximum depth of 4.0 µm. The numbers of pits in a circular region with a radius of 0.25 mm is up to 35; the numbers of pits with a depth greater than 1 µm is not less than 28% of the total number of pits in the entire region.

In a further preferred embodiment of the wafer according to the present invention, the pits on the back side surface have a maximum dimension of the long axis of 37 µm and the pits have a maximum depth of 3.9 µm. The numbers of pits in a circular region with a radius of 0.25 mm is up to 32; the numbers of pits with a depth greater than 1 µm is not less than 28% of the total number of pits in the entire region.

The second aspect of the present invention relates to a method of manufacturing the {100} indium phosphide (InP) wafer according to the first aspect of the invention, which mentioned in the following scheme:

Scheme
    subjecting the {100} indium phosphide (InP) wafer to surface lapping on both sides;
    etching the {100} indium phosphide (InP) wafer by immersing it into etching solutions to produce etch pits;
    removing the {100} indium phosphide wafer that has been etched and washing it with deionized water;
    protecting the back side surface of {100} indium phosphide (InP) wafer that has been etched;
    subjecting the {100} indium phosphide (InP) wafer which has the back side surface been etched and protected to mechanical polishing and chemical polishing, and then washing it with deionized water;
    de-protecting the back side surface of the {100} indium phosphide (InP) wafer;
wherein the etching solutions comprise of an acidic substance, deionized water and an oxidizing agent; the acidic substance, deionized water and oxidizing agent present in the etching solution are in ratios of 1:(5-15):(0.5-3), based on mole ratio; the etching temperature has a range from 15 to 80° C., preferably from 18 to 50° C., and more preferably from 20 to 40° C.; and the etching times are from 5 to 40 min, preferably from 10 to 30 min, and more preferably from 10 to 20 min.

The etching of the present invention can be carried out in one step or in multiple steps. Preferably, in etching, the {100} indium phosphide (InP) wafer may be fixed on a clamping tool; further preferably, the clamping tool is constantly shaking during etching to allow the etching to proceed more rapidly and uniformly.

After the etching is finished, the wafer is washed with deionized water quickly so as to remove the etching solution remaining on the etched {100} indium phosphide wafer surface to prevent from excess etching.

In the manufacturing method of the present invention, the {100} indium phosphide (InP) wafers used are cut from indium phosphide ingots having a diameters range from 2 to 15 cm grown by Vertical Gradient Freeze (VGF), but are not limited to VGF ingot.

In a preferred embodiment of the present invention, the indium phosphide ingot is a monocrystalline indium phosphide ingot.

In a preferred embodiment of the present invention, the indium phosphide ingot is one having a circular transverse cross-section (referred to as a circular indium phosphide ingot) and a longitudinal cross-section in a rectangular or square shape. The circular cross-section generally has a diameter of 2 to 15 cm, preferably 5 to 12 cm.

Of course, the indium phosphide ingot may be one having a transverse cross-section of other shapes, for example, an ingot having a transverse cross-section of special shapes (oval, square, rectangle, etc.) obtained by processing a circular ingot. On such occasions, the wafer obtained after cutting step is a special-shaped wafer.

The wafer cutting is typically carried out using outer-circle cutting machines, inner-circle cutting machines or multi-wire cutting machines that have been known in the art. Multi-wire cutting machines are preferred owing to their good productivity and wafer yield. In general, the wafer obtained after the cutting has a thickness of not more than 850 μm. For example, the cut wafer has a thickness of 250 to 850 μm, preferably 270 to 820 μm, and more preferably 300 to 800 μm.

After wafer cutting, the {100} indium phosphide (InP) wafer will be subjected to surface lapping. The surface lapping is intends to eliminate part of surface damages formed during wafer cutting, lowering the surface roughness, and preliminary smoothing the {100} indium phosphide (InP) substrate. The surface lapping operation can be carried out using lapping machine known from the prior art under known lapping conditions. For example, the lapping powder used in the lapping process; preferably has a median particle size of 2 to 17 μm, preferably 3 to 15 μm, and even preferably 4 to 12 μm.

Preferably, after the wafer cutting step and before the surface lapping step, the cut wafer is subjected to edge-chamfering treatment to form wafer edges with suitable circular arc. Preferably, the cross-section of the wafer edge is arc-shaped. Preferably, the semiconductor wafers, being subjected to this treatment step, have lower wafer edge damage and lower wafer breakage rate in the subsequent steps. The chamfering treatment is usually performed using a chamfering machine. Any chamfering machine known from the prior art can be used in this step. It is understood that if the wafer is of a special-shaped one, the entire periphery of the special-shaped wafer is subjected to chamfering treatment in this step; however, it may also understood that only parts of the wafer edge will subject to chamfering treatment for the special-shaped wafer.

The step of etching the wafer with an etching solution according to the present invention may be performed after the wafer cutting and the surface lapping steps, followed with or without a chamfering step; alternatively, the step of etching may also be performed after the cutting, chamfering and surface lapping steps. It is also possible to perform pre-etching with an etching solution after the mechanical polishing and chemical polishing described below: the side on which pits are desired to be formed is not protected with a protective layer, whereas the other side on which the pits are not desired (i.e., the surface being kept in the polished state) is protected with a protective layer. Nevertheless, it is preferred that the mechanical polishing and chemical polishing are performed after the etching treatment with the etching solution, in which the surface on which pits are desired to be formed is protected with a protective layer to prevent it from being polished.

In the present invention, the protective layer should be understood in a broad sense, including conventional plastic protective layers such as plastic sheets, metal sheet, glass sheet, or ceramic sheets. The protective layer can be fixed to the wafer with, for example, beeswax or arabic gum. The protective layer, after mild heating, can be easily detached (i.e., de-protected).

The wafer of the present invention is typically rough polished and then finish polished to give a wafer product that can be directly used for epitaxial growth.

The purpose of polishing is to eliminate part of the damages layer caused in the previous processing step, to lower the surface roughness, and to smooth the substrate. Rough polishing and finish polishing are performed using known polishing machines under known polishing conditions. For example, polishing agents or powder such as INSEC IPP or Fujimi COMPOL 80 (available from Fujimi Corporation, Japan) can be used.

Since rough polishing and finish polishing per se can be carried out using known methods in the prior art, they are not further described in detail here (detailed illustrations may be found in the Chinese Patent No. CN 104900492A).

Having been subjected to rough polishing and finish polishing, the polished surface of the wafer has a surface roughness of not more than 0.5 nm. The wafer has a thickness of 250 to 850 μm, for example 280 to 750 μm; it has a surface roughness of 0.20 to 0.50 nm, preferably 0.20-0.40 nm, and more preferably 0.20-0.35 nm; and generally the wafer has a diameter of 2 to 15 cm, preferably 5-12 cm.

Preferably, the resulting wafer has a flatness of 3 to 7 μm and preferably 3 to 5 μm.

Optionally, following the final step of the preceding two methods (the step of protecting the front side or back side surface of the wafer), the wafer is further subjected to surface cleaning treatment (including necessary drying), preferably wet surface cleaning treatment. The cleaning treatment process is not particularly limited and can be conducted by any methods known in the prior art as long as it can achieve the desired cleanness of the wafer surface. Preferably, the wet surface cleaning treatment is carried out in a cleanroom rated as Class 1000 or greater. The cleanroom rating is defined in USA Federal Standard 209D cleanroom specifications (see Table 1 below). In this case, only the number of dust particles is usually considered. For example, a class 1,000 cleanroom generally means that the number of particles ≥0.5 μm is ≤1000 per cubic foot; and the number of particles ≥5.0 μm is ≤10 per cubic foot. Preferably, after the surface cleaning treatment in step (5), the surface of the wafer is ascertained to be free of particles and white haze by visual inspection under light irradiation. And the residual amounts of metals Zn and Cu on the surface of the wafer are each ≤10×10$^{10}$ atoms/cm$^2$. In this way, the semiconductor wafer produced by the method of the present invention does not need any further pre-epitaxial treatment and is ready-to-use. Since the prior art methods can be adopted for cleaning, they are not described in detail here.

TABLE 1

USA Federal Standard 209D cleanroom specifications

| Clean room class | Dust particle | | Pressure mmAg | Temperature | | | | | | Air velocity and ventilation rate (time/hr) | Illumination, lux |
| --- | --- | --- | --- | --- | --- | --- | --- | --- | --- | --- | --- |
| | Particle size (μm) | Particle Number (Particles/ ft³) | | Value range °C. | Recommended value °C. | Error value °C. | Max % | Min % | Error % | | |
| 1 | ≥0.5 | ≤1 | >1.3 | 19.4~25 | 22.2 | ±2.8 | 45 | 30 | ±10 | Laminar flow 0.35~0.55 m/s | 1080~1620 |
| | ≥5.0 | 0 | | | | Special need ±1.4 | | | Special need ±5 | | |
| 10 | ≥0.5 | ≤10 | | | | | | | | | |
| | ≥5.0 | 0 | | | | | | | | | |
| 100 | ≥0.5 | ≤100 | | | | | | | | | |
| | ≥5.0 | ≤1 | | | | | | | | | |
| 1000 | ≥0.5 | ≤1000 | | | | | | | | Turbulent flow ≥20 times/hr | |
| | ≥5.0 | ≤10 | | | | | | | | | |
| 10000 | ≥0.5 | ≤10000 | | | | | | | | | |
| | ≥5.0 | ≤65 | | | | | | | | | |
| 100000 | ≥0.5 | ≤100000 | | | | | | | | | |
| | ≥5.0 | ≤700 | | | | | | | | | |

Surface cleaning treatment does not change the physical state of the wafer surface.

The surface-cleaned wafers can be directly used for epitaxial growth.

The third aspect of the present invention relates to an etching solution for manufacturing the {100} indium phosphide (InP) wafer according to the first aspect of the invention, comprising an acidic substance, deionized water and an oxidizing agent, the acidic substance, deionized water and oxidizing agent present in the etching solutions are in ratios of 1:(5-15):(0.5-3). The oxidizing agent should be present in the molar ratio of 0.5 to 3.

In a preferred embodiment of the invention, the acidic substance is an inorganic acid, including but not limited to sulfuric acid, phosphoric acid, hydro-bromic acid, hydrochloric acid, and nitric acid; or an organic acid, including but not limited to acetic acid, propionic acid, and butyric acid; or a mixture thereof, preferably a mixture of sulfuric acid and hydrochloric acid, or preferably a mixture of acetic acid and hydrochloric acid.

In a preferred embodiment of the invention, the oxidizing agent is $H_2O_2$, or a high-valent water-soluble compound having Cr or Mn. The high-valent water-soluble compounds having Cr or Mn are, for example, $KMnO_4$, $K_2Cr_2O_7$ and the like.

The individual components are mixed to yield the etching solutions of the present invention. It is preferred that the etching solution is used immediately after having been formulated.

For a better understanding of the present invention, the present invention will be described in detail with reference to the examples below, but it is to be understood that the examples are merely illustrative for the present invention and are not intended to limit the present invention. In the context of the present invention, the general definitions and the preferred definitions at each level may be combined with one another to form a new technical solution, which is also considered to be disclosed by the present specification.

EXAMPLES

Instruments:
Disk Mill: PULVERISETTE13, available from FRITSCH GmbH;
TXRF (Total Reflection X-Ray Fluorescence Spectrometer): TREX610, available from Technos Co., Ltd., OSAKA, Japan
Surface profiler: SV-600, manufactured by MITUTOYO Corporation, Japan
Contact Thickness Gauge: ID-C125EB, manufactured by MITUTOYO Corporation, Japan;
Multi-line cutting machine: HCT E400SD, HCT Inc. Switzerland;
Metal Organic Chemical Vapor Deposition (MOCVD) Equipment: MC-050, available from AnnealSys Company, France;
Photoluminescence spectrometer: ACCENT RPM2000, Bio-Rad Laboratories, Inc., USA;
Optical microscope: BX53, available from OLYMPUS Corporation, Japan;
Electron scanning microscope: Hitachi S2300, available from Hitachi High Technologies-America, USA.

In each examples, the lapping, rough polishing and finish polishing, wafer protection and cleaning processes are not described in detail because they can be performed by known methods in the prior art (detailed illustrations may refer to the Chinese Patent Publication No. CN 104900492A, especially the conditions as specified under the first group in Example 1).

Unless otherwise specified, the conditions under which the prepared wafer is measured are as follows (the wafer surface to be measured is a surface facing upwards in the polishing machine):

1. The residual amount of trace metal atoms on the surface of the wafer having undergone wet cleaning treatment is measured with TXRF. Acceptance standard: the residual amounts of Zn and Cu each $\leq 10 \times 10^{10}$ atoms/cm².
2. Roughness Measurement
2.1 For the surface of the {100} indium phosphide (InP) wafer on which pits are distributed ("back side"), the surface roughness Ra is measured with a surface profiler; Ra, expressed in micrometers (μm), is not more than 1.5 μm.
2.2 For the surface of the wafer for epitaxial growth that has undergone rough polishing and finish polishing ("front side"), the surface roughness Ra is measured with AFM (Atomic Force Microscopy) (vertical resolution: 0.03 nm, analyzed area: 5 μm×5 μm); Ra is expressed in nanometer (nm). The surface roughness of the polished surface of not more than 0.5 nm is regarded as acceptable.
3. Wafers having no visual scratch are regarded as acceptable products.
4. The wafer thickness is measured with Contact Thickness Gauge.
5. The cross-sectional shape of the pits on the back side surface of the wafer and the depths of the pits were measured by surface profiler (SV-600, manufactured by MITUTOYO Corporation, Japan).

In the case of multiple wafers, the numerical values refer to average values.

Example 1

An etching solution comprising sulfuric acid, hydrochloric acid, $H_2O_2$ and deionized water in a ratio, based on mole ratio, of 1:1:1:12 was formulated by the steps of first mixing deionized water with $H_2O_2$, following by adding hydrochloric acid and finally adding sulfuric acid while stirring.

Figure 2A:
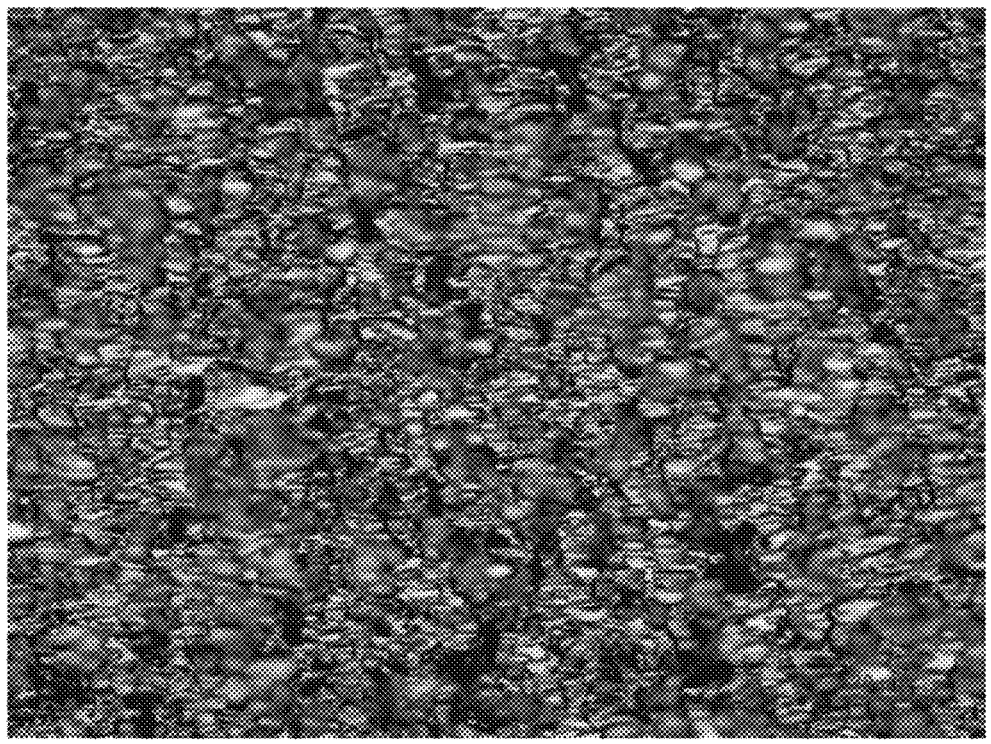
FIG. 2a is an image of the back side surface of the {100} indium phosphide (InP) wafer with irregular elongated pits obtained in Example 1 of the present invention observed by optical microscope (at 500× magnification).
Figure 2B:
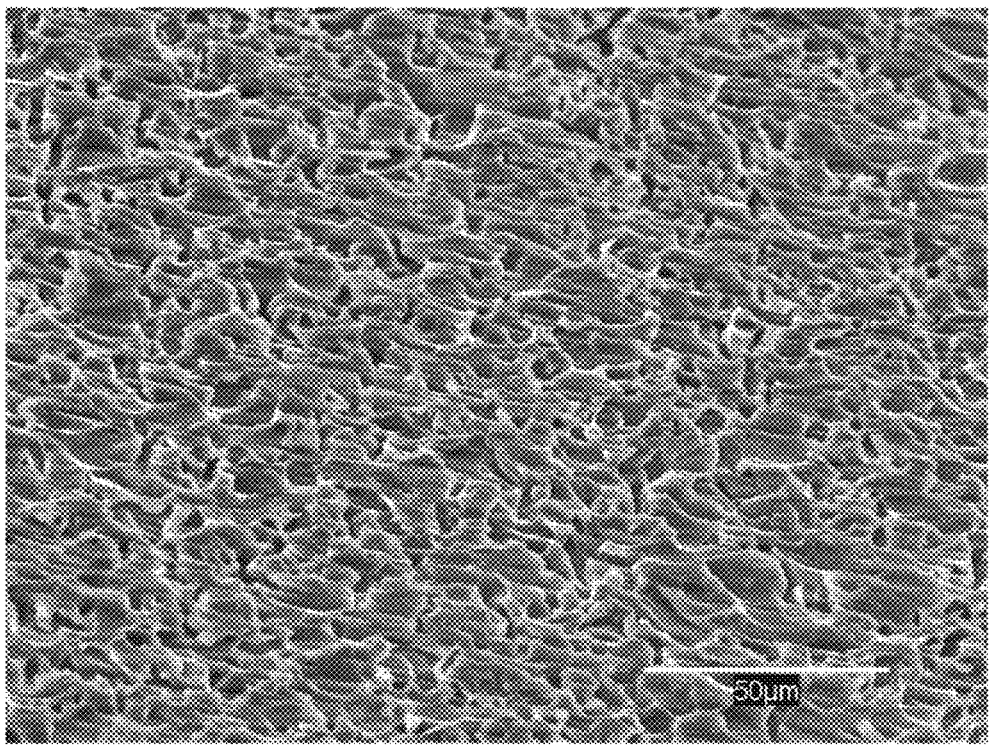
FIG. 2b is an image of the back side surface of the {100} indium phosphide (InP) wafer with irregular elongated pits obtained in Example 1 of the present invention observed by scanning electron microscope (at 500× magnification).
Figure 2C:
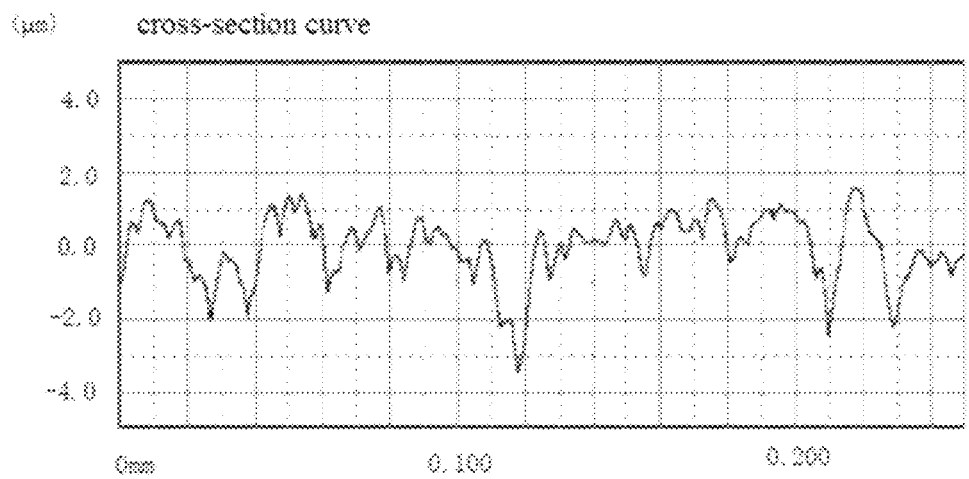
FIG. 2c is a surface roughness profile along the long axis of the irregular pits of the back side surface of the {100} indium phosphide (InP) wafer obtained in Example 1 of the present invention.
Figure 2D:
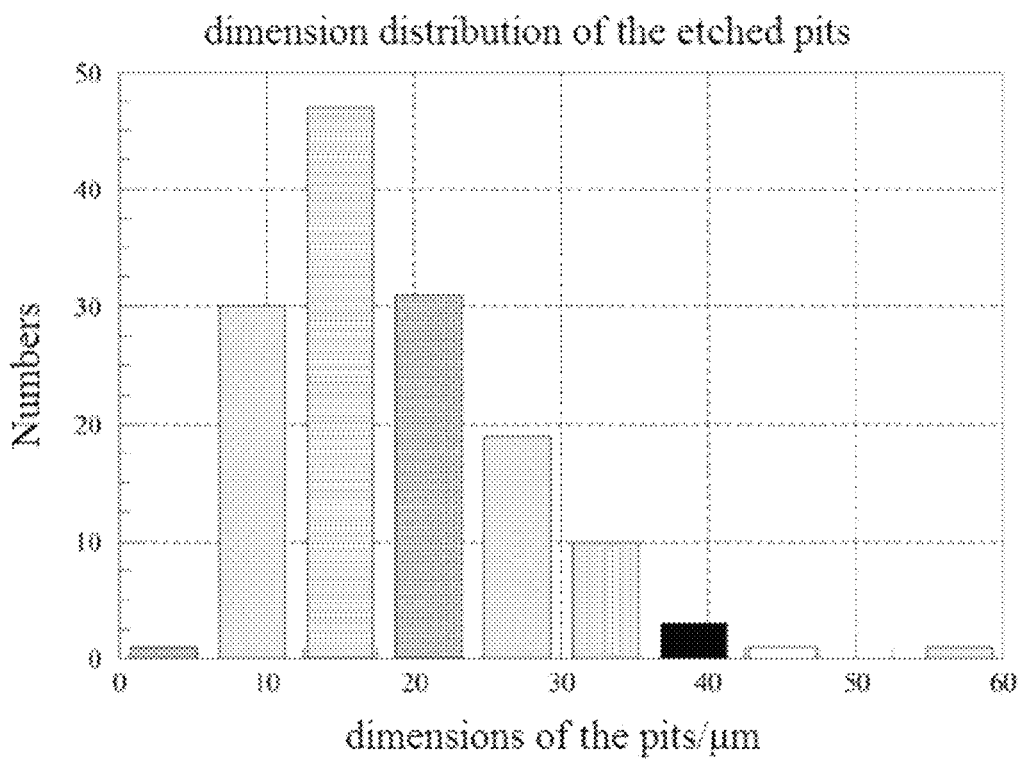
FIG. 2d is a histogram showing the distribution of dimension data of the long axis of the elongated irregular shape pits on the back side surface of the {100} indium phosphide (InP) wafer obtained in Example 1 of the present invention.
Figure 2E:
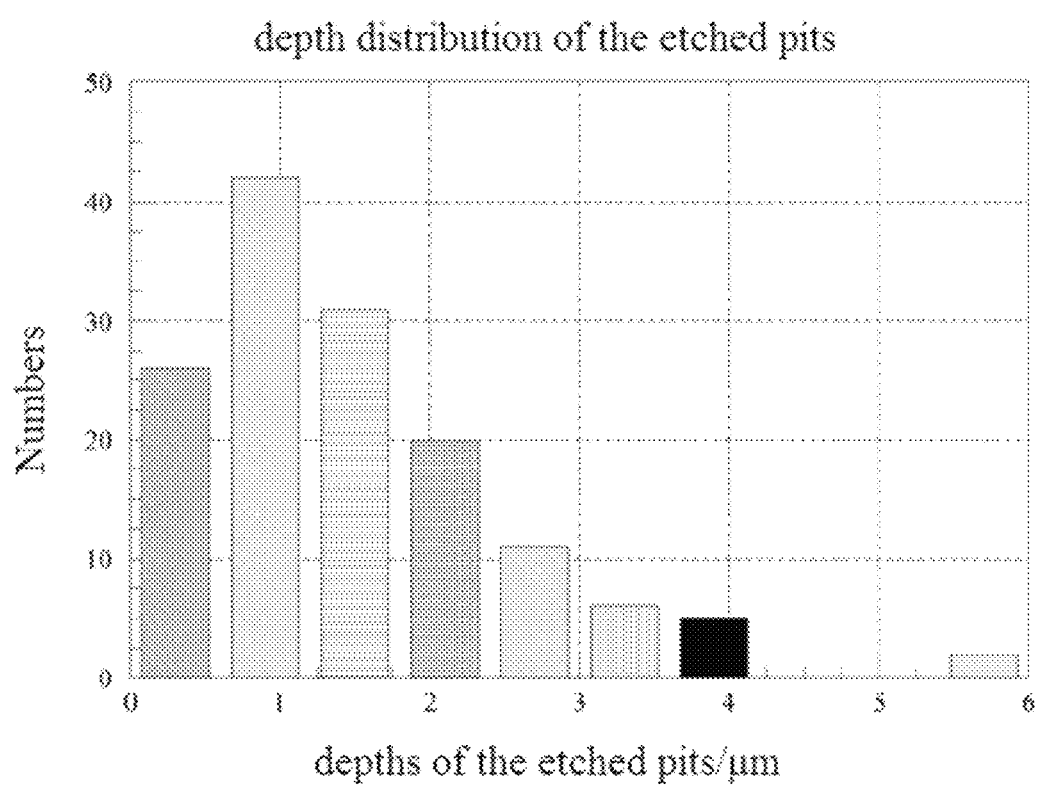
FIG. 2e is a histogram showing the distribution of depth data of elongated irregular shape pits the back side surface of the {100} indium phosphide (InP) wafer obtained in Example 1 of the present invention.
Figure 4A:
FIGS. 4a and 4b each are a cross-sectional view showing cut the {100} indium phosphide (InP) wafer after been subjected to chamfering treatment.
Figure 4B:

A {100} indium phosphide (InP) wafer was manufactured by a method comprising the following steps, wherein the above etching solution is used:
(1) Cutting a {100} indium phosphide indium wafer from an indium phosphide ingot having a diameter of 10 cm with a multi-wire cutting machine, wherein the indium phosphide ingot is a monocrystalline indium phosphide ingot having a circular transverse cross-section (referred to as circular indium phosphide ingot) and a rectangular longitudinal cross-section, the circular transverse cross-section has a diameter of 10 cm;
(1') Subjecting the cut wafer in the step (1) to edge-chamfering treatment using a chamfering machine (as shown in FIG. 4a) so that the wafer has arc-shaped edges (FIG. 4a);
(1") Subjecting both sides of the {100} indium phosphide (InP) wafer to surface lapping, the lapping compound used for surface lapping is commercially available alumina powder;
(2) Immersing the {100} indium phosphide (InP) wafer into the above mentioned etching solution at 20° C. for 10 mins;
(3) Removing the etched {100} indium phosphide (InP) wafer and washing it with deionized water;
(4) Protecting the back side surface of the etched {100} indium phosphide (InP) wafer;
(5) Subjecting the etched {100} indium phosphide (InP) wafer that has back side surface been protected to mechanical polishing and chemical polishing, and them washing it with deionized water;
(6) De-protecting the back side surface of the {100} indium phosphide (InP) wafer to give a {100} indium phosphide (InP) wafer having irregular pits distributed on the back side surface, further, washing and drying the wafer, and then observing the surface morphology thereof with optical microscope (observation position being the center of the circular wafer). FIGS. 2a and 2b show the surface morphology of the back side surface of the wafer. As can be seen from FIG. 2a, the wafer obtained in Example 1 has irregular shape pits on the back side surface. FIG. 2b shows their stereo morphology. The profiles and depths of the elongated pits on the back side surface of the wafer were measured by surface profiler as shown in FIG. 2c. The distribution data are shown in FIGS. 2d and 2e.

The resulting wafer has a thickness of 300 μm, a surface roughness Ra of 0.8 μm, the pits on the back side surface have an elongated shape with a maximum dimension of the long axis of 60 μm and the pits have a maximum depth of 5.6 μm.

The numbers of pits in the three regions A, B and C as shown in FIG. 1 and the percentage of the pits with a depth greater than 2 μm over the entire region are shown in Table 1 below.

TABLE 1

| Measured items | Region A | Region B | Region C |
| --- | --- | --- | --- |
| Numbers of pits | 20 | 21 | 24 |
| Percentage of pits with a depth greater than 2 μm over the entire area | 21% | 22% | 22% |

As can be seen from Table 1, the numbers of pits in the three regions A, B and C are not significantly different and the percentage of pits with a depth greater than 2 μm over the entire region are also approximately the same. Clearly, the etching degrees in these three sampling regions are approximately the same and thus a uniform sample is made. Therefore, the average number of pits in the circular region of the wafer having a radius of 0.25 mm is 22, and the average percentage of pits having a depth greater than 2 μm is 22%.

As can be seen from the dimensional distribution of the long axis of elongated pits on the back side surface of the wafer obtained in Example 1 shown in FIG. 2d, the dimensions are mainly between 6 and 35 μm, particularly between 12.5 and 17.5 μm.

As can be seen from the depth distribution of the pits in Example 1 as shown in FIG. 2e, the depths of pits are mainly between 0.1 and 4.0 μm, particularly between 0.7 and 1.7 μm.

Example 2

An etching solution comprising acetic acid, hydrochloric acid, $H_2O_2$ and deionized water in a ratio, based on mole ratio, of 1:2:9:30 was formulated.

Figure 3A:
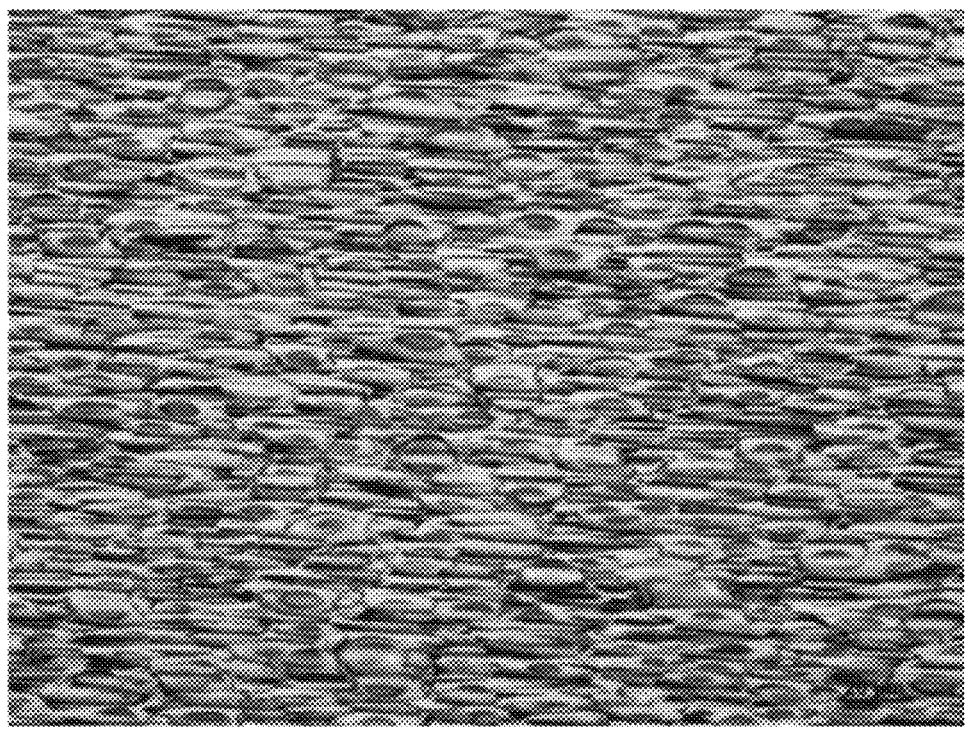
FIG. 3a is an image of the back side surface of the {100} indium phosphide (InP) wafer with a smooth elongated pits obtained in Example 2 of the present invention observed by optical microscope (at 500-fold magnification).
Figure 3B:
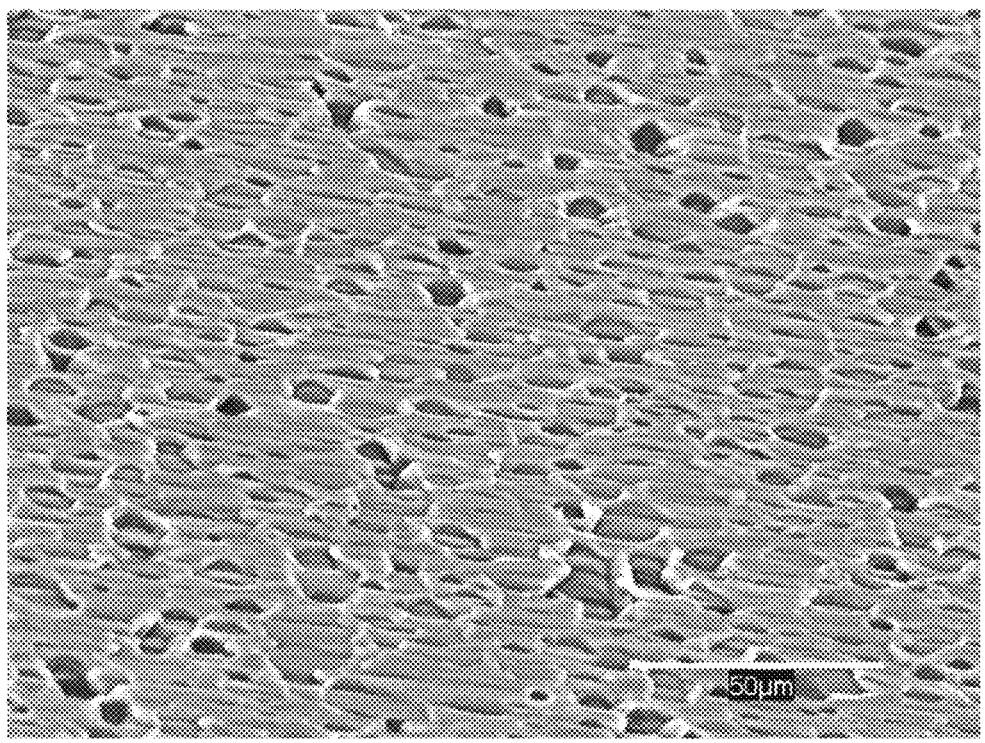
FIG. 3b is an image of the back side surface of the {100} indium phosphide (InP) wafer with a smooth elongated pits obtained in Example 2 of the present invention observed by scanning electron microscope (at 500-fold magnification).
Figure 3C:
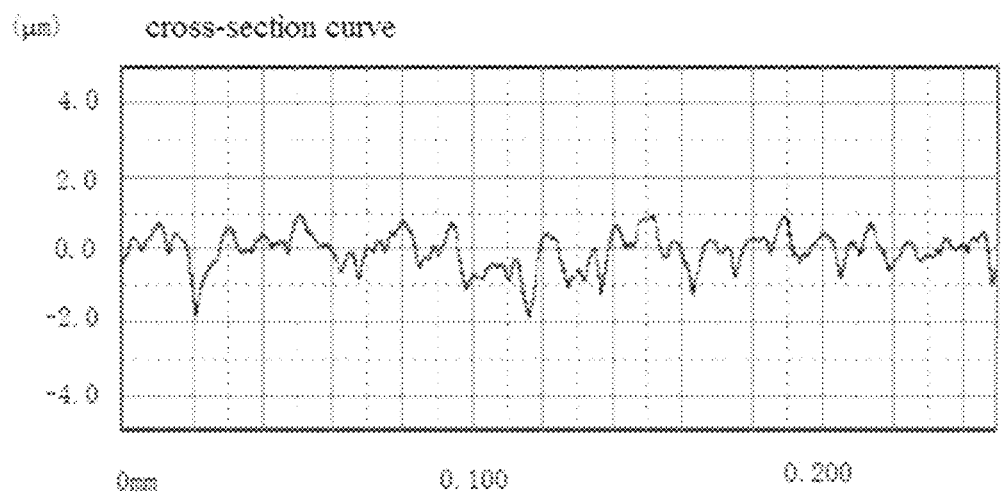
FIG. 3c is the surface roughness profile along the long axis of the smooth elongated pits of the back side surface of the {100} indium phosphide (InP) wafer obtained in Example 2 of the present invention.
Figure 3D:
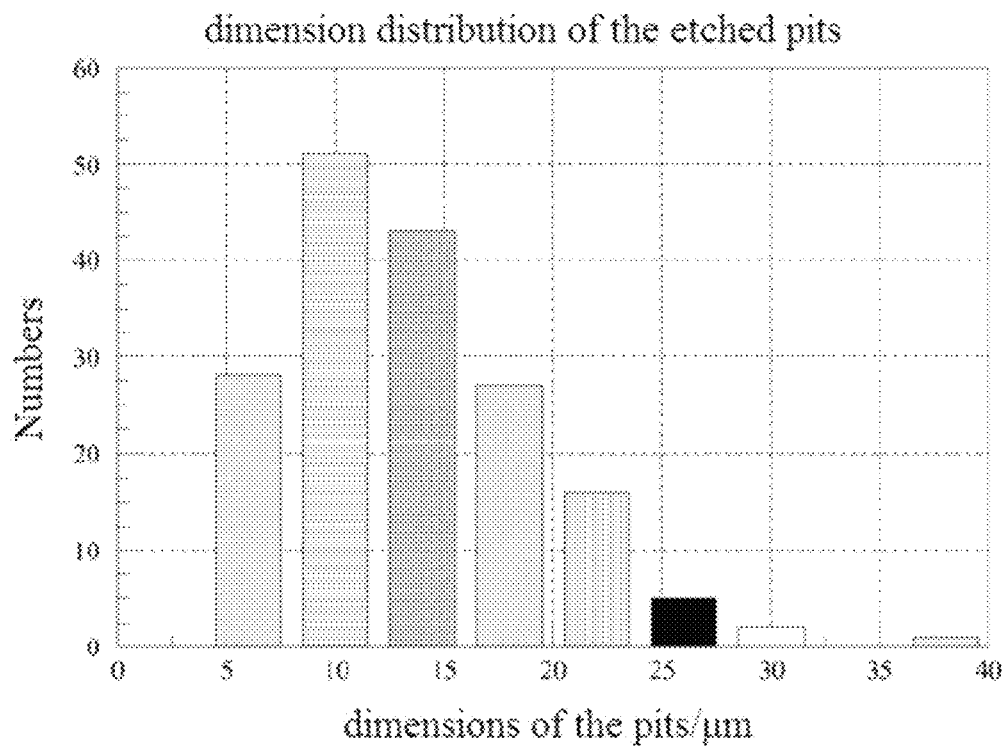
FIG. 3d is a histogram showing the distribution of dimension data of the long axis of the smooth elongated pits on the back side surface of the {100} indium phosphide (InP) wafer obtained in Example 2 of the present invention.
Figure 3E:
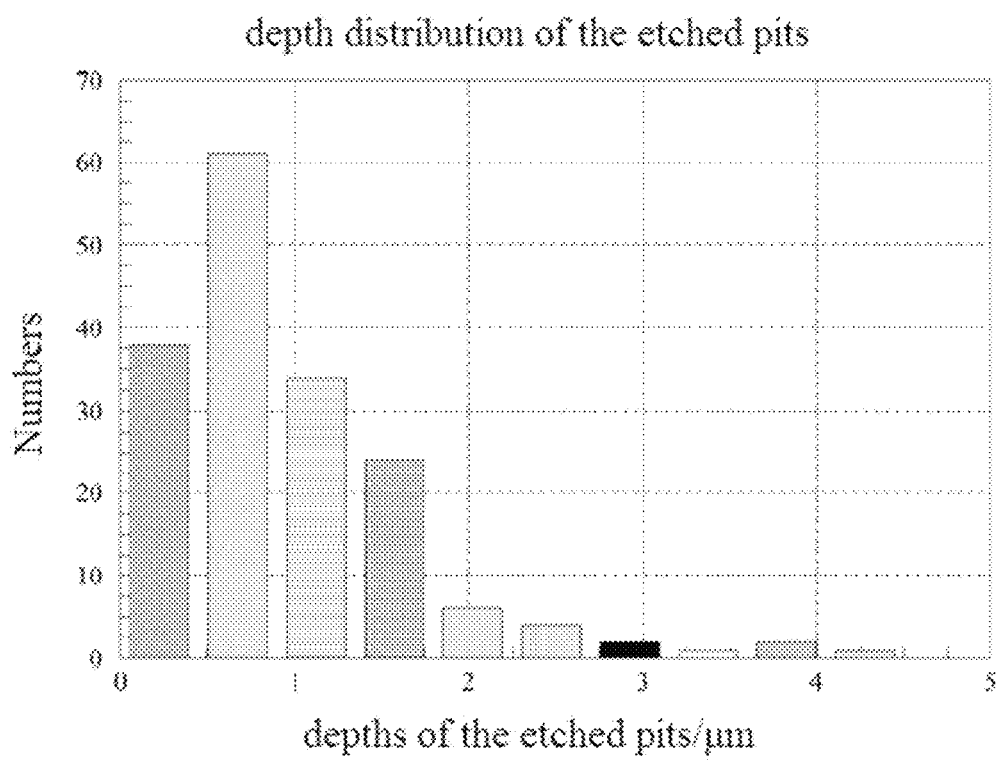
FIG. 3e is a histogram showing the distribution of depth data of the smooth elongated pits on the back side surface of the {100} indium phosphide wafer obtained in Example 2 of the present invention.

A {100} indium phosphide (InP) wafer was manufactured by a method comprising the following steps, wherein the above etching solution is used:
(1) Cutting a {100} indium phosphide (InP) wafer from an indium phosphide ingot having a diameter of 10 cm with a multi-wire cutting machine, wherein the indium phosphide ingot is a monocrystalline indium phosphide ingot having a circular transverse cross-section (referred to as circular indium phosphide ingot) and a rectangular longitudinal cross-section, the circular transverse cross-section has a diameter of 10 cm;
(1') Subjecting the cut wafer in the step (1) to edge-chamfering treatment using a chamfering machine (as shown in FIG. 4a) so that the wafer has arc-shaped edges (FIG. 4a);
(1") Subjecting both sides of the {100} indium phosphide (InP) wafer to surface lapping, the lapping compound used for surface lapping is commercially available alumina powder;
(2) Immersing the {100} indium phosphide (InP) wafer into the above mentioned etching solution at 40° C. for 20 mins;
(3) Removing the etched {100} indium phosphide (InP) wafer and washing it with deionized water;
(4) Protecting the back side surface of the etched {100} indium phosphide (InP) wafer;

(5) Subjecting the etched {100} indium phosphide (InP) wafer that has back side surface been protected to mechanical polishing and chemical polishing, and them washing it with deionized water;
(6) De-protecting the back side surface of the {100} indium phosphide (InP) wafer to give a {100} indium phosphide (InP) wafer having pits distributed on the back side surface, further, washing and drying the wafer, and then observing the surface morphology thereof with optical microscope (observation position being the center of the circular wafer). FIGS. 3a and 3b show the surface morphology of the wafer. As can be seen from FIG. 3a, the wafer obtained in Example 2 has smooth elongated pits. The direction of the long axis is parallel to the [011] crystal orientation. FIG. 3b shows the stereo morphology of the pits. The profiles and depths of the pits on the back side surface of the wafer were measured by surface profiler as shown in FIG. 3c. The distribution data of the long axis of elongated pits and the depth of the pits are shown in FIGS. 3d and 3e respectively.

The resulting wafer has a thickness of 500 μm, a surface roughness Ra of 0.4 μm, the elongated pits on the back side have a maximum dimension of the long axis of 40 μm and the pits have a maximum depth of 4.0 μm.

The numbers of pits in the three regions A, B and C as shown in FIG. 1 and the percentage of the pits with a depth greater than 1 μm over the entire region are shown in Table 2 below.

TABLE 2

| Measured items | Region A | Region B | Region C |
| --- | --- | --- | --- |
| Numbers of pits | 31 | 35 | 32 |
| Percentage of pits with a depth greater than 1 μm over the entire area | 27% | 28% | 28% |

As can be seen from Table 2, the numbers of pits in the three regions A, B and C are not significantly different and the percentage of pits with a depth greater than 1 μm over the entire region are also approximately the same. Clearly, the etching degrees in these three sampling regions are approximately the same and thus a uniform sample is made. Therefore, the average number of pits in the circular region of the wafer having a radius of 0.25 mm is 33, and the average proportion of pits having a depth greater than 1 μm is 28%.

As can be seen from the dimensional distribution of the long axis of the pits on the back side surface of the wafer obtained in Example 2 shown in FIG. 3d, the dimensions of the long axis are mainly between 4.5 and 27.0 μm, particularly between 7.5 and 12.5 μm.

As can be seen from the depth distribution of the pits in Example 1 as shown in FIG. 3e, the depths of pits are mainly between 0.1 and 2.5 μm, particularly between 0.1 and 1.5 μm.

As can be seen from the surface roughness profile in FIGS. 2c and 3c, the back side surfaces of the wafers obtained in Examples 1 and 2 shown fluctuation amplitude of the surface morphologies of the pits obtained in Example 2 is lower than that of Example 1, indicating that the back side surface of the wafer obtained in Example 2 has lower roughness or smoother than that of the wafer obtained in Example 1.

The wafers as measured under the above items 1, 2.2 and 3 are acceptable.

As evident from the above examples, the etching solution of the present invention can result in a controllable formation of pits on the back side surface of the {100} indium phosphide (InP) wafer. Thus provide a controllable emissivity of the wafer back side surface.

APPLICATION EXAMPLE

The surface (front side) of the wafer obtained in Example 1 that has undergone rough polishing, finish polishing and cleaning treatment was used directly as substrate for epitaxial growth.

In order to illustrate the influence of the product of the present invention on epitaxial layer performance, the photoluminescence uniformity of the epitaxial layer grown on the substrate obtained in Example 1—the {100} indium phosphide (InP) wafer having pits distributed on the back side surface is compared with epitaxial layer grown on other indium phosphide (InP) substrate wafers without pits on the back side surface. A metal-organic chemical vapor deposition (MOCVD) device is used as the epitaxial growth apparatus. The epitaxial growth structure consists of initially growing an indium phosphide buffer layer with a thickness of 1 μm on the indium phosphide substrate, and then growing an indium gallium arsenide (InGaAs) epitaxial layer with a thickness of 2 μm on the buffer layer, the growth temperature being 645° C. and the growth pressure being 40 mbar. Photoluminescence spectrometer having an excitation wavelength of 532 nm was used to measure the uniformity of the wavelength and luminance of the epitaxial wafers.

Figure 5A:
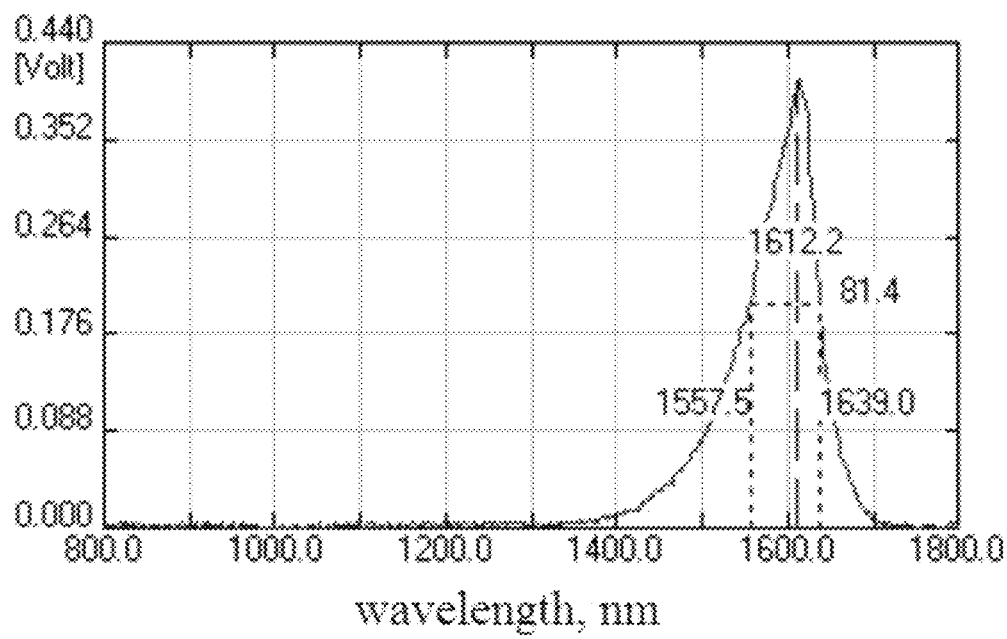
FIG. 5a is a measurement result of the photoluminescence (abbreviated as PL) spectra over the wavelength range from 800 nm to 1800 nm at a single point in the center of an indium-gallium-arsenide epitaxial layer grown on the {100} indium phosphide (InP) substrate with pits on the back side surface obtained in Using Example 1 of the present invention.

FIG. 5a shows a full-wavelength PL spectrum of an indium gallium arsenide layer measured at a single point of the epitaxial layer on the {100} indium phosphide substrate obtained in the Application Example 1 of the present invention. The peak wavelength of the PL (photoluminescence) spectrum measured at the central point of the epitaxial layer is 1612.2 nm; said spectrum has a narrow width and high peak intensity, showing good performance of the substrate.

Figure 5B:
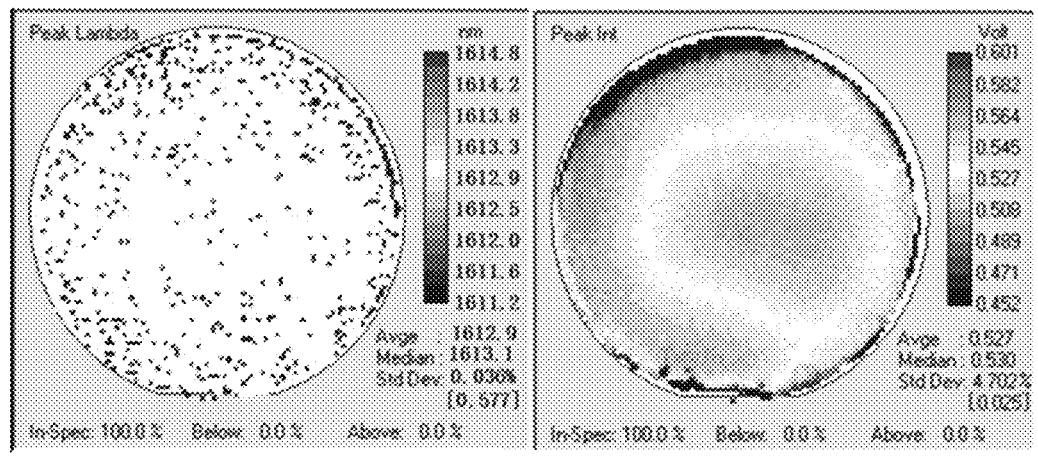
FIGS. 5b and 5c each are respectively PL intensity maps showing the uniformity of the peak wavelength and luminescence intensity of the indium-gallium-arsenide epitaxial layer across the entire wafer on the {100} indium phosphide (InP) substrate with pits on the back side surface obtained in Example 1 of the present invention and on the substrate without pits on the back side surface as a control.
Figure 5C:
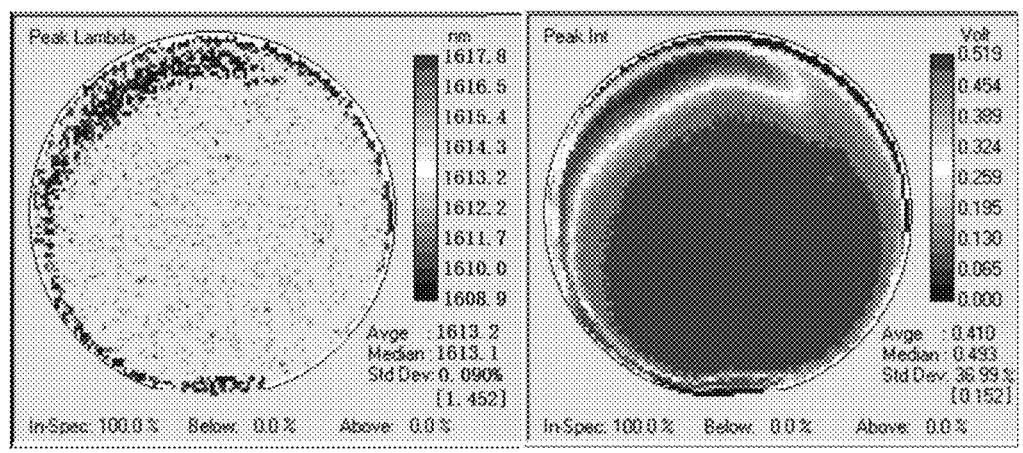

FIGS. 5b and 5c show comparisons of the uniformity of the peak wavelength and luminescence intensity distributions of indium gallium arsenide epitaxial layers grow on the {100} indium phosphide substrate with pits obtained in Application Example 1 of the present invention and on the {100} indium phosphide substrate without pits (the products were obtained by the method analogous to Example 1 except that the etching step is omitted). Measured by a PL spectrometer respectively.

From the measurement results, it can be seen that the epitaxial layer on the {100} indium phosphide substrate with pits on the back side surface has more uniform wavelength and luminescence intensity distribution and hence has higher quality, as compared with the epitaxial layer on the substrate without pits on the back side surface. Through PL measurements on the epitaxial wafers, it can be found that compared with the indium phosphide (InP) wafer without pits on the back side surface, the {100} indium phosphide (InP) wafer obtained in Application Example 1 during the epitaxial growth allows its back side surface to absorb heat radiation more efficiently and more uniformly, and thus is advantageous for the uniformity of the growth of the epitaxial layer, thereby enhancing the quality of the epitaxial layer. The surface of the {100} indium phosphide (InP) wafer with pits obtained according to the present invention matches well with the epitaxial conditions.

In addition, the method for manufacturing the {100} indium phosphide (InP) wafer according to the present invention is easy to operate; the indium phosphide wafer has a surface morphology that is easy to control and has good reproducibility.

Although the invention has been described with reference to certain embodiments, those skilled in the art will recognize that the embodiments may be modified or equivalently substituted without departing from the spirit and scope of the invention. The scope of the invention is defined by the appended claims.

This application claims priority to Chinese Application No. 201710612344.1, filed on Jul. 25, 2017, the entire disclosure of which is incorporated herein by reference.

The invention claimed is:

1. A {100} indium phosphide wafer, comprising:
a wafer having a back side surface; and
pits on the back side surface,
wherein the pits on the back side surface have an elongated shape with a maximum dimension of the long axis of 65 μm, and
the pits have a maximum depth of 6.0 μm.

2. The {100} indium phosphide wafer according to claim 1, wherein
the maximum dimension of the long axis is 45 μm, and
the maximum depth is 4.5 μm.

3. The {100} indium phosphide wafer according to claim 1, wherein
the wafer has a first side surface and a second side surface, and
pits on the first side surface, or on the first and second side surfaces.

4. The {100} indium phosphide wafer according to claim 2, wherein
the wafer has a first side surface and a second side surface, and
pits on the first side surface, or on the first and second side surfaces.

5. The {100} indium phosphide wafer according to claim 1, wherein
the back side surface of the wafer has a surface roughness Ra in a range of 0.2 and 1.5 μm.

6. The {100} indium phosphide wafer according to claim 2, wherein
the back side surface of the wafer has a surface roughness Ra in a range of 0.2 and 1.5 μm.

7. The {100} indium phosphide wafer according to claim 1, wherein
the wafer has a diameter of 2 to 15 cm; and
a thickness of 250 to 850 μm.

8. The {100} indium phosphide wafer according to claim 2, wherein
the wafer has a diameter of 2 to 15 cm; and
a thickness of 250 to 850 μm.

9. A method for manufacturing the {100} indium phosphide wafer according to claim 1, wherein the method comprises:
subjecting the indium phosphide wafer to surface lapping on both sides;
etching the indium phosphide wafer by immersing it into etching solutions to produce etch pits;
removing the indium phosphide wafer that has been etched and washing it with deionized water;
protecting the back side surface of the indium phosphide wafer that has been etched;
subjecting the indium phosphide wafer which has had the back side surface protected and has been etched to mechanical polishing and chemical polishing, and then washing it with deionized water; and
de-protecting the back side surface of the indium phosphide wafer,
wherein the etching solutions are comprise of an acidic substance, deionized water and an oxidizing agent, the acidic substance, deionized water and oxidizing agent present in the etching solutions are in ratios of 1:(5-15):(0.5-3), based on mole ratio; the etching solution has a temperature in a range of from 15 to 80° C.; and the etching time is from 5 to 40 min.

10. The method according to claim 9, wherein the {100} indium phosphide wafer to be subjected to surface lapping treatment is cut from an indium phosphide ingot that has a diameter of 2 to 15 cm.

11. The method according to claim 9, wherein the protecting is carried out using a protective layer, wherein the protection layer is a plastic sheet, a metal sheet, a glass sheet, or a ceramic sheet; the protective layer is fixed to the wafer with beeswax or Arabic gum; and the protective layer is detached after heating.

12. The method according to claim 10, wherein the protecting is carried out using a protective layer, wherein the protection layer is a plastic sheet, a metal sheet, a glass sheet or a ceramic sheet; the protective layer is fixed to the wafer with beeswax or Arabic gum; and the protective layer is detached after heating.

13. An etching solution for manufacturing the {100} indium phosphide wafer according to claim 1, comprising an acidic substance, deionized water and an oxidizing agent; the acidic substance, deionized water and oxidizing agent present in the etching solutions are in the ratio of 1:(5-15):(0.5-3), and the oxidizing agent is present in the molar ratio of 0.5 to 3, based on mole ratio.

* * * * *